(12) United States Patent
Fujii et al.

(10) Patent No.: US 8,941,135 B2
(45) Date of Patent: Jan. 27, 2015

(54) LIGHT EMISSIVE CERAMIC LAMINATE AND METHOD OF MAKING SAME

(75) Inventors: Hironaka Fujii, Carlsbad, CA (US); Toshitaka Nakamura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 552 days.

(21) Appl. No.: 13/181,922

(22) Filed: Jul. 13, 2011

(65) Prior Publication Data

US 2012/0199858 A1     Aug. 9, 2012

Related U.S. Application Data

(60) Provisional application No. 61/364,555, filed on Jul. 15, 2010.

(51) Int. Cl.
*H01L 33/50*     (2010.01)

(52) U.S. Cl.
CPC .................................. *H01L 33/507* (2013.01)
USPC ........................ 257/98; 257/E33.061; 438/29

(58) Field of Classification Search
USPC ............................... 257/98, E33.061; 438/29
See application file for complete search history.

(56) References Cited

U.S. PATENT DOCUMENTS

| | | | |
|---|---|---|---|
| 5,998,925 A | 12/1999 | Shimizu et al. | |
| 6,069,440 A | 5/2000 | Shimizu et al. | |
| 7,070,300 B2 | 7/2006 | Harbers et al. | |
| 7,180,240 B2 | 2/2007 | Noguchi et al. | |
| 7,294,861 B2 | 11/2007 | Schardt et al. | |
| 7,344,952 B2 | 3/2008 | Chandra | |
| 7,361,938 B2 | 4/2008 | Mueller et al. | |
| 7,402,840 B2 | 7/2008 | Krames et al. | |
| 7,462,502 B2 | 12/2008 | Paolini et al. | |
| 7,521,862 B2 | 4/2009 | Mueller et al. | |
| 7,554,258 B2 | 6/2009 | Rossner et al. | |
| 2010/0301367 A1 | 12/2010 | Nakamura et al. | |
| 2010/0301739 A1 | 12/2010 | Nakamura et al. | |

FOREIGN PATENT DOCUMENTS

WO     2008112710 A     9/2008

OTHER PUBLICATIONS

Encyclopedia of Physical Science and Technology, vol. 7, 230-231 (Robert A Meyers ed., 1987).

*Primary Examiner* — Marvin Payen
(74) *Attorney, Agent, or Firm* — Law Office of Katsuhiro Arai

(57) ABSTRACT

A light emitting device includes: at least one light emitting component (LEC) comprising a light-emitting face having a longest linear dimension $D_1$; at least one wavelength-converting consolidated monolithic component (WCC) having a light-receiving face, a light-emitting face, and a peripheral edge. The WCC is radiationally linked to and spaced apart from the LEC at a distance $D_2$, $D_2$ being less than $D_1$, wherein a projection edge of the light-emitting face of the LEC and the peripheral edge of the WCC define a shortest distance $D_3$ therebetween, wherein a surface area of the light-receiving face of the WCC is at least 120% of that of the light-emitting face of the LEC, and the LEC and WCC are positioned relative to each other to satisfy $D_3/D_2 \geq 1$.

16 Claims, 11 Drawing Sheets providing a light emitting component (LEC) comprising a light emitting face and having a longest linear dimension D1, the LEC emitting light with a wavelength between about 360 nm to about 500 nm (step 1);

↓ providing at least one wavelength converting consolidated monolithic component (WCC) having a light receiving face, a light emitting face and a peripheral edge, the WCC re-emitting the light at a different wavelength and having at least 120% of the light emitting surface area of the light emitting component, wherein an edge of a projection of the LEC upon the light receiving face and the peripheral edge define a shortest distance D3 therebetween (step 2);

↓ positioning the wavelength converting component (WCC) from the light emitting component a distance D2, D2 being less than D1 (step 3);

↓ positioning the LEC and WCC relative each other, such that distance D3 and the distance D2 substantially satisfy the following condition: D3/D2 ≥ 1

Fig. 2A

LIGHT EMISSIVE CERAMIC LAMINATE AND METHOD OF MAKING SAME

CROSS-REFERENCE TO RELATED APPLICATIONS

This application claims the benefit of U.S. Provisional Application No. 61/364,555, filed Jul. 15, 2010, and the disclosure of which is herein incorporated by reference in its entirety.

BACKGROUND OF THE INVENTION

1. Field of the Invention

This disclosure relates generally to white light-emitting devices using a semiconductor as a light source and a luminescent wavelength converting component, which devices provide reduced chromatic variation and improved luminescent efficiency.

2. Description of the Related Art

Solid state light-emitting devices such as light-emitting diodes (LEDs), organic light-emitting diodes (OLEDs) sometimes called organic electroluminescent devices (OELs), and inorganic electroluminescent devices (IELs) have been widely utilized for various applications such as flat panel displays, indicators for various instruments, signboards, and ornamental illuminations, etc. As the emission efficiency of these light-emitting devices continues to improve, applications that require much higher luminance intensity, such as automobile headlights and general lighting, may soon become feasible. Among these applications, white LED is one of the promising candidates and has attracted much attention.

Conventional white LED's are manufactured based on a combination of a blue LED and yellow light-emitting YAG: Ce phosphor powder used as a wavelength-converting material dispersed in an encapsulant resin such as epoxy and silicone, as disclosed in U.S. Pat. No. 5,998,925 and U.S. Pat. No. 6,069,440. The wavelength-converting material is so disposed as to absorb some part of the blue LED light-emission and re-emit the light at a different wavelength as yellow or green-yellow light. The combination of the blue light from the LED and the green-yellow light from the phosphor results in perceived white light. A typical device structure is shown in FIGS. 1A and 1B. A submount 10 shown in FIG. 1A has a blue LED 11 mounted thereon and encapsulated by a protective resin 15. As shown in FIG. 1B, the blue LED 11 is covered with a transparent matrix 13, often constituted by silicon resin, in which YAG:Ce phosphor powder 12 is disposed. However, as shown in FIG. 2, since the particle size of YAG: Ce phosphor powder utilized for this system is around 1-10 μm, the YAG:Ce powder 12 dispersed in the transparent matrix 13 can cause strong light scattering. As a result, a considerable portion of both incident light 18 from the blue LED 11 and yellow light 19 emitted from the YAG:Ce powder ends up being backscattered and dissipated, causing a loss of white light emission.

One solution to this problem is to form a monolithic ceramic member as a wavelength-converting material. Ceramic bodies have been disposed in the path of light emitted by a light source as shown in U.S. Pat. Nos. 7,361,938 and 7,554,258. The ceramic member can be spaced apart from or abutting the LED light source as shown in U.S. Pat. No. 7,554,258. However, greater market demands are being made for reduced color binning variance and higher luminescent performance.

In addition, some LED constructs utilize p- and n-type contacts (flip-chip led light sources) (as shown in U.S. Pat. Nos. 7,521,862, and 7,402,840). These constructs can have ceramic bodies with about the same linear dimensions or surface area as the LED light source, wherein the ceramic bodies are spaced from but substantially radiationally in contact with the LED light source. However, these types of constructs do not utilize wire contacts and thus do not require a spaced apart relationship between the LED light source and the ceramic bodies to provide a passage for the connecting wires. Nevertheless, embodiments with p- and n-type contacts have described distancing the ceramic bodies from the light source (as shown in U.S. Pat. No. 7,070,300).

The manufacture of LEDs has also increased the demand for better products, and thus a reduction of color variability within a plurality of manufactured LEDs. U.S. Pat. No. 7,344,952 describes a luminescent encapsulation film disposed over an array of LED light sources. U.S. Pat. No. 7,294,861 describes an LED array using phosphor tape. However none of these attempts have provided an LED construct that provides consistent color and reduced variability. U.S. Pat. No. 7,462,502 describes a method for color control of a light emitting device by altering the thickness or amount of the ceramic or light emitting member. However, where the emissive layer is a ceramic layer having a thickness on the order of 100 μm, altering the thickness of the layer to adjust the color is difficult. Several U.S. patents responded to this problem by providing cover members or filters to adjust the chromaticity of a device (as shown in U.S. Pat. Nos. 7,180,240 and 7,402, 840). However, none of these attempts have considered a construction that, without the use of additional filters or cover members, provides consistent color and reduced variability.

SUMMARY OF THE INVENTION

Some embodiments provide a light emitting device comprising: at least one light emitting component (LEC) for emitting light with a wavelength between about 360 nm to about 500 nm, said LEC comprising a light emitting face having a longest linear dimension $D_1$; at least one wavelength-converting component (WCC) for re-emitting the light at a different wavelength, said WCC having a light receiving face, a light emitting face, and a peripheral edge, said WCC being radiationally linked to and spaced apart from the LEC at a distance $D_2$, $D_2$ being less than $D_1$, wherein a projection edge of the light-emitting face of the LEC and the peripheral edge of the WCC define a shortest distance $D_3$ therebetween, wherein a surface area of the light receiving face of the WCC is at least 120% of a surface area of the light emitting face of the LEC, and wherein the LEC and WCC are positioned relative to each other to satisfy $D_3/D_2 \geq 1$.

As illustrated in FIG. 2A, some embodiments provide a process of manufacturing at least one light emitting device comprising providing a light emitting component (LEC) for emitting light with a wavelength between about 360 nm to about 500 nm, said LEC comprising a light emitting face having a longest linear dimension $D_1$ (step 1); providing at least one wavelength converting consolidated monolithic component (WCC) for re-emitting the light at a different wavelength, said WCC having a light receiving face, a light emitting face, and a peripheral edge, said WCC having a surface area of the light receiving face which is at least 120% of a surface area of the light emitting face of the LEC, wherein a projection edge of the light-emitting face of the LEC and the peripheral edge of the WCC define a shortest distance $D_3$ therebetween (step 2); positioning the WCC apart from the LEC at a distance $D_2$, $D_2$ being less than $D_1$ (step 3); and positioning the LEC and WCC relative to each other to satisfy $D_3/D_2 \geq 1$ (step 4).

These and other embodiments are described in detail below. In this disclosure, when multiple specific points of a variable are indicated, any two specific points thereof constitute a range of the variable, in which any points falling within the range are usable unless stated otherwise. Further, any ranges indicated may include or exclude the endpoints.

For purposes of summarizing aspects of the disclosed embodiments and the advantages achieved over the related art, certain objects and advantages of the disclosed embodiments are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of the disclosed embodiments will now be described with reference to the drawings which are intended to illustrate and not to limit the invention. The drawings are oversimplified for illustrative purposes and are not necessarily to scale.

FIG. 2A illustrates an exemplary embodiment of a method of preparing emissive layers disclosed herein.

DETAILED DESCRIPTION

The present inventors have discovered that the color variation amongst plural manufactured LEDs can be reduced by considering several factors, independently or in concert, such as the size relationship of the semiconductor light emitting source and a wavelength converting component, and the distance therebetween. In addition, the described size and positional arrangements can also benefit the thermal stability of the light emitting device and reduce the temperature of operation.

Figure 1A:
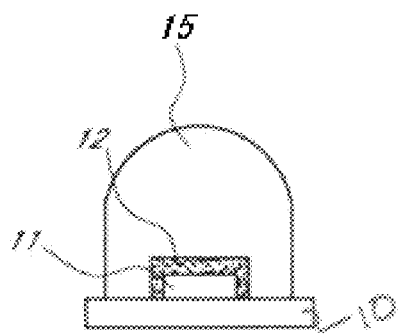
FIGS. 1A and 1B illustrate a cross-sectional view of conventional white LED devices.
Figure 1B:
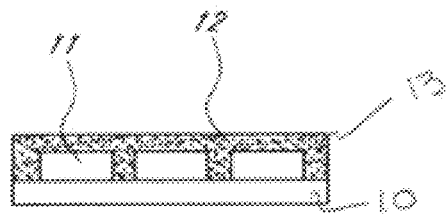
Figure 2:
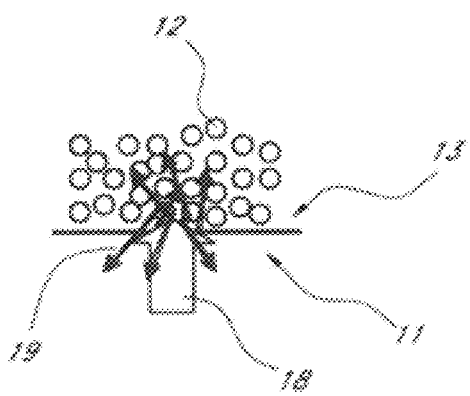
FIG. 2 illustrates how the light emitted from a conventional blue LED device is backscattered by micron-sized yellow phosphor powder in the conventional white LED devices.
Figure 2B:
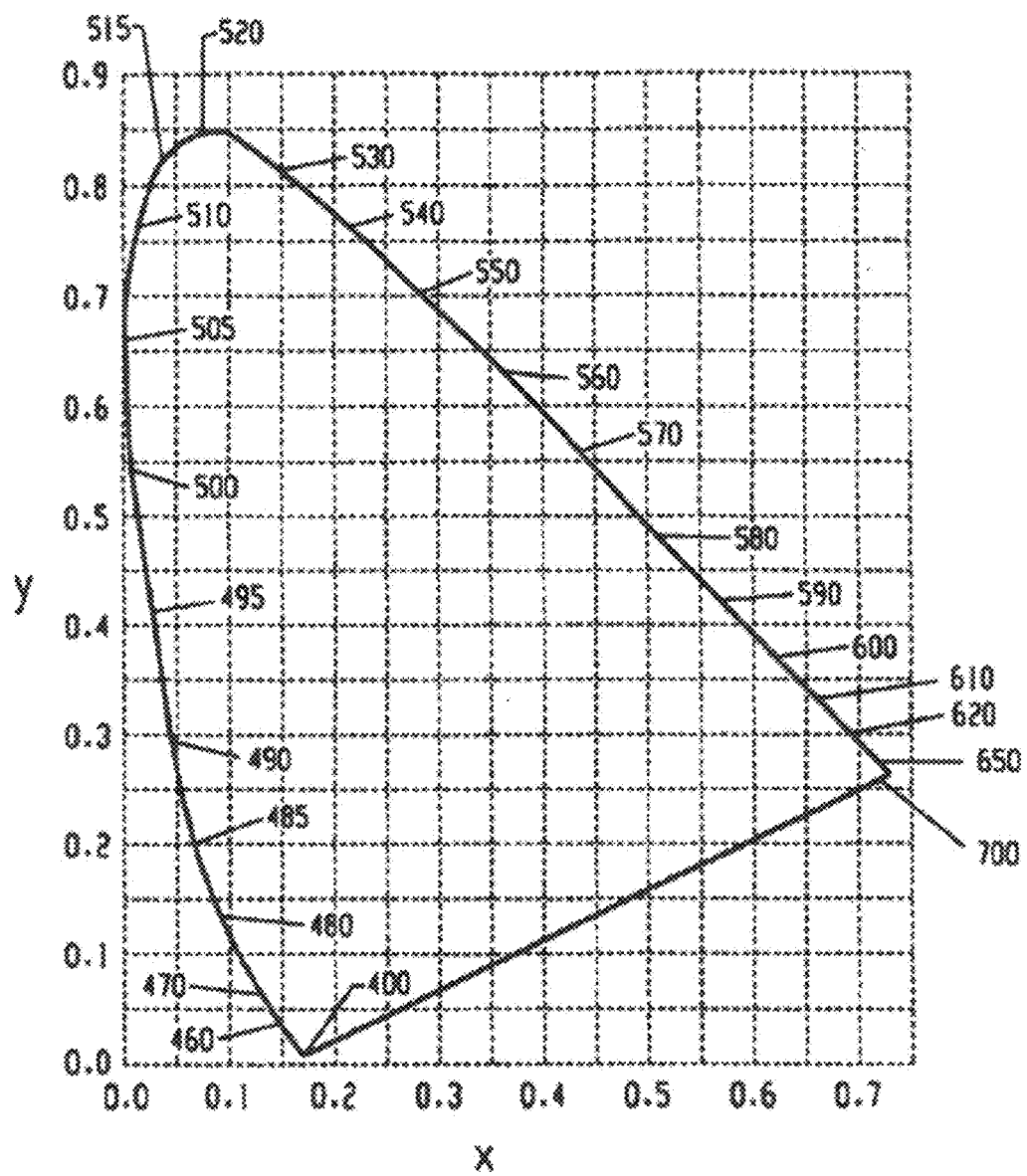
FIG. 2B is a depiction of the CIE (Commission Internationale de L'Eclairage, 1931) chromacity diagram.

As shown in FIG. 2B, a standard CIE (Commission Internationale de L'Eclairage, 1931) chromaticity diagram can be used to characterize the light emitted from a light emitting device by Cy (y-coordinates) and Cx (x-coordinates), see for example, "Encyclopedia of Physical Science and Technology, vol. 7, 230-231 (Robert A Meyers ed., 1987), the disclosure of which is incorporated by reference in its entirety with respect to the standard CLE measurement.

As shown in FIGS. 3, 3A-3C, some embodiments of the invention provide a light emitting device 20 comprising (a) a light emitting component 22 (LEC) mounted on submount 10, comprising a light emitting face 24 and having a longest linear dimension $D_1$, the LEC emitting light with a wavelength between about 360 nm to about 500 nm; and (b) at least one wavelength converting component 26 (WCC) radiationally linked to the light emitting component 22, the WCC 26 re-emitting the light at a different wavelength, the WCC 26 having a WCC peripheral edge 28, a light receiving surface area contained within a light receiving face 30 for receiving the light emitted from the LEC and a WCC light emitting face 32 opposite from the light receiving face 30. The WCC 26 being disposed a shortest distance $D_2$ between the light receiving face 30 and the light emitting face 24 wherein $0 \leq D_2 < D_1$. Radiationally linked refers to the elements are associated with each other so radiation from one is transmitted to the other. In some embodiments, the longest linear dimension refers to the longest edge or orthogonal dimension.

The longest orthogonal dimension is considered to include the longest diameter in ovoid- or hour-glass-shaped elements. In some embodiments, the wavelength converting component 26 is disposed such that the identified shortest distance between the light receiving face 30 of the WCC 26 and the light emitting face 24 of the light emitting component 22 is measured as $D_2$ wherein $0 \leq D_2 < D_1$.

Also as shown in FIGS. 3 and 3A-3C, in some embodiments, $D_2$ intersects the receiving face 30 at Point A, and intersects the light emitting face 24 at Point B, and defines the shortest distance $D_3$ between Point A and the WCC peripheral edge 28 of the light receiving face 30. In some embodiments, the dimension of the peripheral edge of the light receiving face 30 may be less than the dimension of the peripheral edge of the WCC light emitting face 32. In some embodiments, the dimension of the peripheral edge of the light emitting face 30 may be greater than the dimension of the peripheral edge of the WCC light emitting face 32. Point A is along the projection of the light emitting face 24 upon the light receiving face 30. Points A and B are so chosen as to minimize the measured distance $D_2$ followed by a minimization of the distance $D_3$. LEC (22) and WCC (26) are positioned relative to each other, such that the distance $D_2$ and the distance $D_3$ substantially satisfy the following condition: $D_3/D_2 \geq 1$ or the ratio of $D_3/D_2$ is at least about one.

Figure 3:
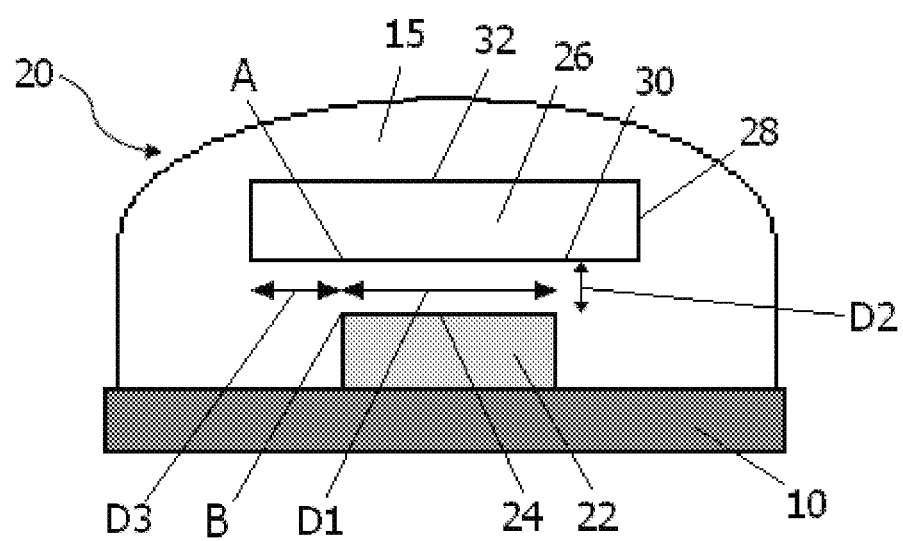
FIG. 3 illustrates a cross-sectional view of an embodiment of a light emitting device with reduced chromic variability.
Figure 3A:
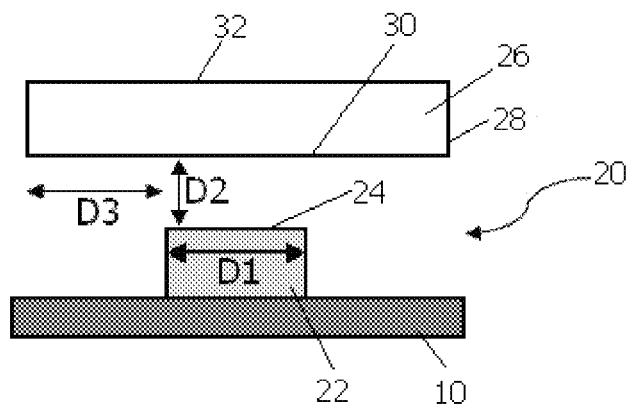
FIG. 3A illustrates a cross-sectional view of an embodiment of a light emitting device with reduced chromic variability.
Figure 3B:
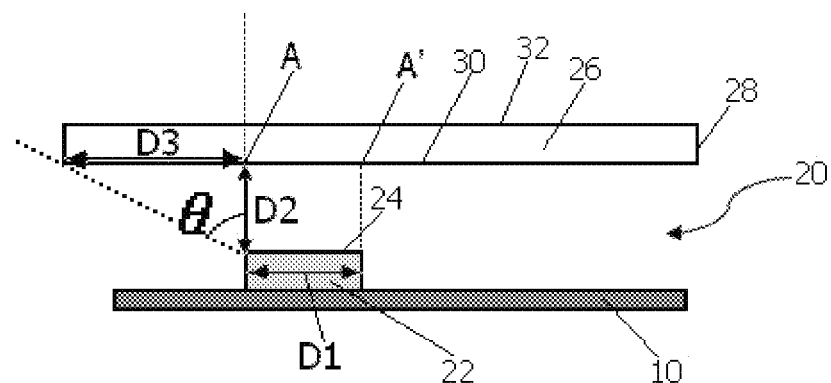
FIG. 3B illustrates a cross-sectional view of another embodiment of a light emitting device with reduced chromic variability.
Figure 3C:
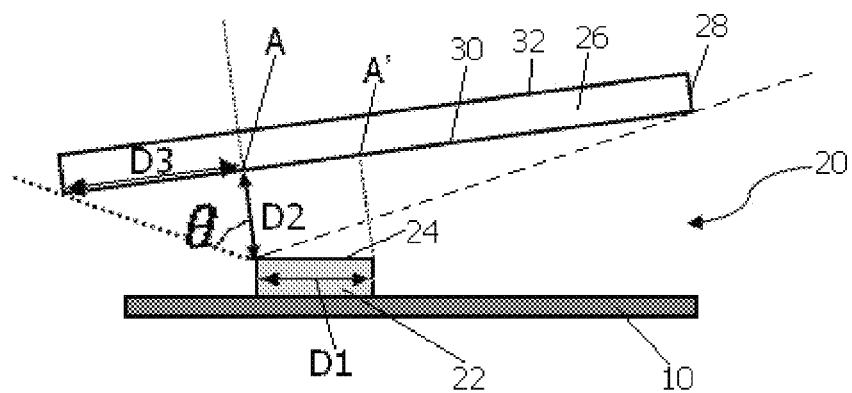
FIG. 3C illustrates a cross-sectional view of another embodiment of a light emitting device with reduced chromic variability.

As shown in FIGS. 3 and 3A-3C, in some embodiments, the projection of the light emitting face 24 (A-A') upon the light receiving face 30 is substantially entirely contained within the light receiving face 30 of the WCC 26. Also as shown in FIGS. 3 and 3A, in some embodiments, the projection is substantially concentrically contained within light receiving face 30. In some embodiments, the projection of the light emitting face 24 upon the light emitting device on a plane parallel to the face is fully contained within the projection of the WCC structure on the same plane, and all the linear dimensions of the projection of the WCC structure exceed the corresponding linear dimensions of the projection of the light emitting face of the light emitting device, i.e., the WCC structure has a non-zero overhang all around the light emitting device. Further, as shown in FIG. 3C, in some embodiments, the light receiving face 30 of the WCC 26 is angled relative to the light emitting face 24 of the LEC 22, while maintaining D1, D2, D3, and θ (the angle of the right triangle formed by D2 and D3 at the edge of the light emitting face 24) shown in FIG. 3B.

While not wanting to be limited by theory, the size and or positioning of the WCC 26 is selected to convert a substantial amount (e.g., at least 50% or at least 75%) of the light emitted by the light emitting component 22 without having to resort to an additional filter element. This relationship can be defined as the D3/D2 relationship. In some embodiments D3/D2 is greater than 1, for example, at least about 1.1, 1.25, 1.5, 1.67, 1.75, 2.0, 3.0 4.0, 7.5 or about 10.0. In some embodiments, D3/D2 is less than 30, or less than 20. In some embodiments, where the distance from the light emitting component 22 is about 100 μm to the WCC 26, for a sized LED light source (1×1 mm), D3 is at least about 110 μm, 125 μm, 150 μm, 167 μm, 175 μm, 200 μm, 300 μm, 400 μm, 750 μm or about 1000 μm. In some embodiments where the WCC 26 is about twice the linear dimension (4 times the surface area) of the LED emitting surface area, the distance D2 from the light emitting component 22 to the WCE 26 is at least about 400 μm, about 333 μm, about 300 μm, about 250 μm, about 200 μm, about 150 μm, about 100 μm or about 50 μm, for a sized LED light source (1×1 mm), and D3 is an overhang and at least about 110 μm, 125 μm, 150 μm, 167 μm, 175 μm, 200 μm, 300 μm, 400 μm, 750 μm or about 1000 μm.

In some embodiments, the light receiving surface area of the WCC 26 is at least 120% of the light emitting surface area of the light emitting component. In some embodiments where the WCC is positioned about 50 μm, or about 100 μm or about 150 μm away from the light source, the light source has a surface area of about 1 mm² (1×1 mm), and the light receiving surface area of the wavelength converting WCC is at least about 149%, about 156%, about 169%, about 178%, about 182%, about 196%, about 324%, about 625%, about 900% of the light emitting surface area of the light emitting component.

In some embodiments, $D_1$ is between about 0.5 mm to about 3.5 mm. In some embodiments, $D_1$ is about 1.0 mm, about 2.0 mm, or about 3.0 mm. In some embodiments, $D_2$ is between about 25 μm to about 400 μm, between about 50 μm to about 150 μm, or about 100 μm. In some embodiments, $D_3$ is between about 0.5 mm to about 2.5 mm, e.g., about 110 μm, 125 μm, 150 μm, 167 μm, 175 μm, 200 μm, 300 μm, 400 μm, 750 μm, or 1000 μm.

The WCC 26 may be positioned, placed or fixed over the LED 22 using encapsulant resin 15, which can be the same material used for protecting the LED from abrasion or mechanical deformation, other specific adhesives, a laminated spacer layer or a mechanical holder. Exemplary encapsulant resins or adhesives may include any of silicone, epoxy, low-melting-point-glass, transparent adhesives, or other materials. If UV-LED is used instead of blue LED, epoxy or other material, which has light absorption over the wavelength region of UV light emitted from LED, can be degraded, or if LED is driven at very high operating condition like powder LED, the close proximity of the LED surface can be very hot, the adhesive also can be degraded. Therefore, thermally and UV durable material like silicone and low-melting-point glass may be preferably utilized.

The wavelength converting component 26 is radiationally connected to so as to receive light from the light emitting component 22 and re-emit the light at least one different wavelength. In some embodiments, the WCC 26 comprises partially sintered ceramics, glass-phosphor composites, sintered ceramics or substantially translucent ceramic. The term partially sintered refers to a ceramic having less than or equal to about 95% theoretical porosity for the particular material. The term sintered refers to a ceramic having greater than 95% theoretical porosity. The term glass-phosphor composite refers to a composite comprising a phosphor dispersed within a non-porous matrix. Exemplary non-porous matrices include silicates, epoxies, etc. The term substantially translucent ceramic refers to a ceramic that transmits at least about 40%, about 60%, about 80%, about 90%, about 95%, about 97%, or about 98% of the impinged radiation thereupon. The luminescent materials useful for WCC are chosen optionally to achieve the desired white point (color temperature) by taking the absorption and emission spectra of phosphor into consideration. In some embodiments, the luminescent wavelength converting component comprises a polycrystalline phosphor and a dopant, as represented by formulas such as, but not limited to $(A_{1-x}E_x)_3B_5O_{12}$, $(Y_{1-x}E_x)_3B_5O_{12}$, $(Gd_{1-x}E_x)_3B_5O_{12}$, $(La_{1-x}E_x)_3B_5O_{12}$, $(Lu_{1-x}E_x)_3B_5O_{12}$; $(Tb_{1-x}E_x)_3B_5O_{12}$; $(A_{1-x}E_x)_3Al_5O_{12}$; $(A_{1-x}E_x)_3Ga_5O_{12}$; $(A_{1-x}E_x)_3In_5O_{12}$; $(A_{1-x}Ce_x)_3B_5O_{12}$; $(A_{1-x}Eu_x)_3B_5O_{12}$; $(A_{1-x}Tb_x)_3B_5O_{12}$; $(A_{1-x}E_x)_3Nd_5O_{12}$; and the like. In some embodiments, the ceramic comprises a garnet, such as a yttrium aluminum garnet, with a low dopant concentration. Some embodiments provide a composition represented by the formula $(Y_{1-x}Ce_x)_3Al_5O_{12}$. In any of the above formulas, x may be in the range of about 0.0001 to about 0.005, from about 0.0005 to about 0.004, or alternatively, from about 0.0008 to about 0.0025. In some embodiments, examples of luminescent materials include $Y_3Al_5O_{12}$:Ce, $(Y, Tb)_3Al_5O_{12}$:Ce, $(Y, Gd)_3(Al, Ga)_5O_{12}$:Ce, $(Sr, Ca, Ba)_2SiO_4$:Eu, $Ca_3Sc_2Si_3O_{12}$:Ce, $Ba_3MgSi_2O_8$:Eu, $BaMgAl_{10}O_{17}$:Eu, $La_2O_2S$:Eu, $SrGa_2S_4$:Eu, $CaAlSiN_3$:Eu, $Ca_2Si_5N_8$:Eu, and CaSiAlON:Eu. In some embodiments the WCC comprises at least one phosphor. In some embodiments the WCC comprises at least two phosphors, the phosphors having peak emissive wavelengths of at least 15 nm apart.

Submount 10 can be metal, ceramic, multilayer printed wire board, LTCC, HTCC or other suitable thermal conductor. The submount 10 can optionally include a heat sink (not shown). It can be electrically insulating or electrically conducting. Submount 10 advantageously comprises a highly thermally conductive metal such as copper, tungsten or molybdenum and/or a highly thermally conductive ceramic such as aluminum nitride (ALN), silicon carbide (SiC) or aluminum oxide ($Al_2O_3$). In an embodiment it can be nickel-plated copper molybdenum copper clad. Metal powder mixtures such as molybdenum copper, can be used in order to match the thermal expansion coefficient of the LED dies. The light emitting component can optionally be embedded in a molding material.

In some embodiments, the light emitting component 22 is a gallium nitride compound semiconductor capable of efficiently exciting garnet fluorescent materials activated with a dopant. The light emitting components 22 employing gallium nitride compound semiconductor can be made by forming a light emitting layer of gallium nitride semiconductor such as InGaN on a substrate in the MOCVD process. The structure of the light emitting component may be homostructure, heterostructure or double-heterostructure which has MIS junction, PIN junction or PN junction. Various wavelengths of emission can be selected depending on the material of the semiconductor layer and the crystallinity thereof. It may also be made in a single quantum well structure or multiple quantum well structure where a semiconductor activation layer is formed as thin as quantum effect can occur. According to the present invention, a light emitting diode capable of emitting with higher luminance without deterioration of the phosphor can be made by making the activation layer of the light emitting component in single quantum well structure of InGaN.

When a gallium nitride compound semiconductor is used, while sapphire, spinel, SiC, Si, ZnO or the like may be used as the semiconductor substrate, use of sapphire substrate is preferable in order to form gallium nitride of good crystallinity. A gallium nitride semiconductor layer is formed on the sapphire substrate to form a PN junction via a buffer layer of GaN, AlN, etc. The gallium nitride semiconductor has N type conductivity under the condition of not doped with any impurity, although in order to form an N type gallium nitride semiconductor having desired properties (carrier concentration, etc.) such as proved light emission efficiency, it is preferably doped with N type dopant such as Si, Ge, Se, Te, and C. In order to form a P type gallium nitride semiconductor, on the other hand, it is preferably doped with P type dopant such as Zn, Mg, Be, Ca, Sr and Ba. Because it is difficult to turn a gallium nitride compound semiconductor to P type simply by doping a P type dopant, it is preferable to treat the gallium nitride compound semiconductor doped with P type dopant in such process as heating in a furnace, irradiation with low-speed electron beam and plasma irradiation, thereby to turn it to P type. After exposing the surfaces of P type and N type gallium nitride semiconductors by the etching or other process, electrodes of the desired shapes are formed on the semiconductor layers by sputtering or vapor deposition.

The semiconductor wafer which has been formed can be cut into pieces by means of a dicing saw, or separated by an external force after cutting grooves (half-cut) which have width greater than the blade edge width. Or otherwise, the wafer can be cut into chips by scribing grid pattern of extremely fine lines on the semiconductor wafer by means of a scriber having a diamond stylus which makes straight reciprocal movement. Thus the light emitting component of gallium nitride compound semiconductor can be made.

In order to emit white light with the light emitting diode of the first embodiment, wavelength of light emitted by the light emitting component is preferably from 360 nm to 530 nm inclusive in consideration of the complementary color relationship with the phosphor and deterioration of resin, and more preferably from 420 nm to 490 nm inclusive. It is further more preferable that the wavelength be from 450 nm to 475 nm, in order to improve the emission efficiency of the light emitting component and the phosphor. In other embodiments, the LEC 22 can also be an organic light emitting device (OLED) or an (IEL).

Figure 4A:
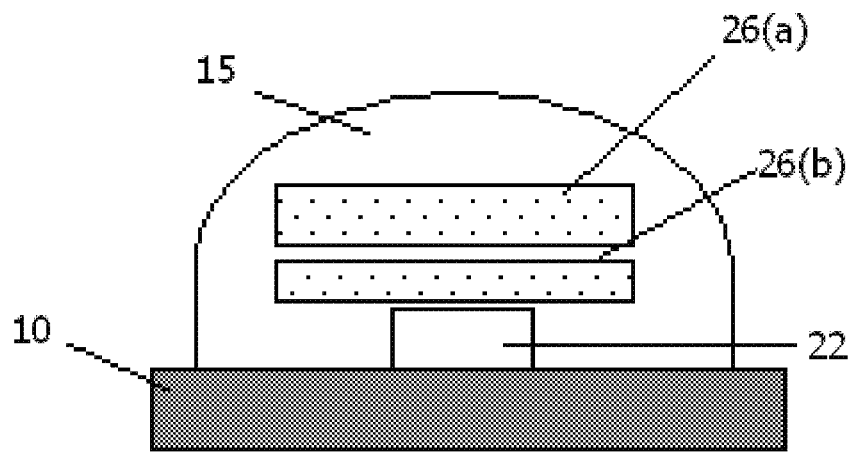
FIG. 4 illustrates a cross-sectional view of another embodiment of a light emitting device with reduced chromic variability.
Figure 4B:
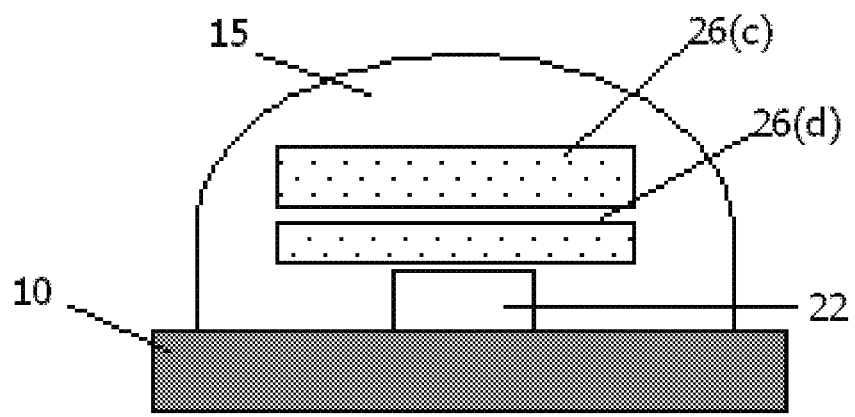

In other embodiments, any kinds of color combinations of LEDs 22 and luminescent WCCs 26 may be applied in this invention. FIG. 4A shows the combination of a blue LED 22, mounted on submount 10 and encapsulated by resin 15, a yellow emitting WCC 26a and a red emitting WCC 26b to improve color reproducibility in accordance with the present description. In another embodiment, green emitting WCC 26c and red emitting WCC 26d may be used in combination of a blue LED 22 mounted on submount 10 encapsulated by resin 15, as depicted in FIG. 4B.

Figure 5:
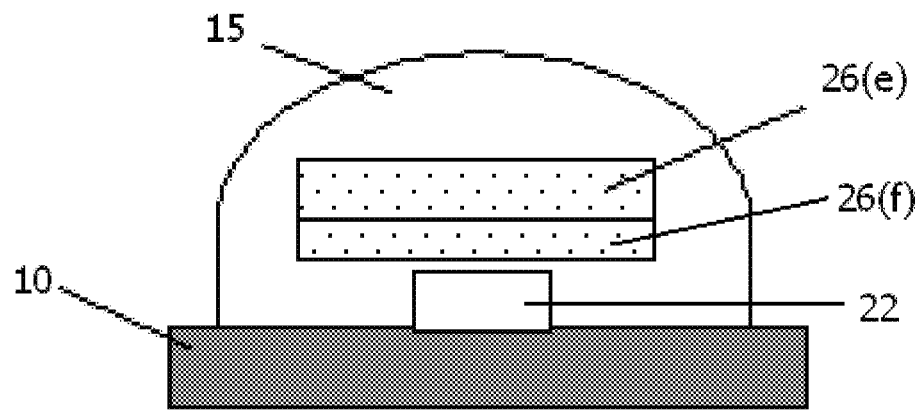
FIG. 5 illustrates a cross-sectional view of an embodiment of a light-emitting device.

In other embodiments, a laminated composite luminescent WCCs 22F further comprising a first WCC 26e and a second WCC 26f may be applied in this invitation as seen in FIG. 5.

Figure 6:
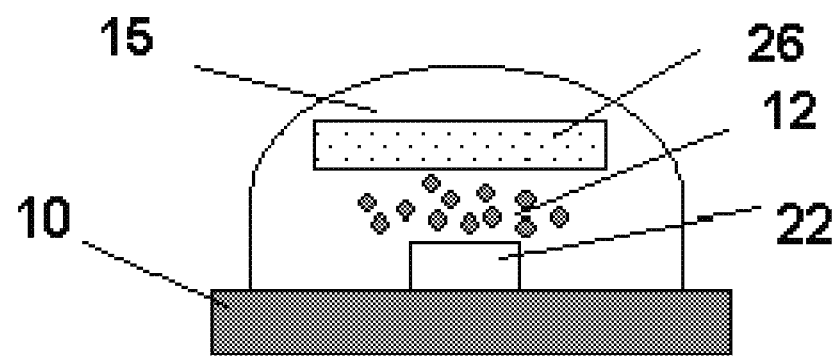
FIG. 6 illustrates a cross-sectional view of an embodiment of a light-emitting device.

In another embodiment, light emitting device 20 includes light emitting component 22 mounted upon submount 10 in radiationally coupling with luminescent WCC 26 in the position and relative disposition described above. As shown in FIG. 6, in another embodiment, the WCC may comprise a WCC 26 and transparent matrix layer, e.g., encapsulant resin 15, having conventional phosphor powder 12 dispersed therein.

In other embodiments, the light emitting device in accordance with this disclosure may emit other light aside from white light. For example, green, yellow, orange, and red LED 20 also may be made based on blue or UV light emitting source 20. In some embodiments, the light emitting device has emission by the light emitting component and the at least one WCC of white light having a CIE color chromaticity (x, y) of (0.33±0.15, 0.33±0.15). In one embodiment, the light emitting component emits between about 360 nm to about 500 nm and the WCC emits between about 520 nm to about 590 nm. In some embodiments, the light emitting component emits between about 360 nm to about 500 nm and the wavelength converting component emits between about 490 nm to about 570 nm and between about 620 nm to about 750 nm. In some embodiments, a plurality of light emitting devices of claim 1, wherein the plurality of devices have a $C_y$ variation of less than about ±0.003.

Figure 7A:
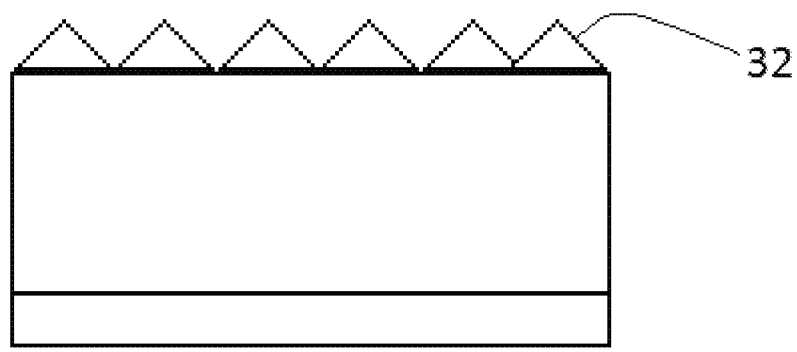
FIGS. 7A and 7B illustrate cross-sectional views of embodiments of a light-emitting device.
Figure 7B:
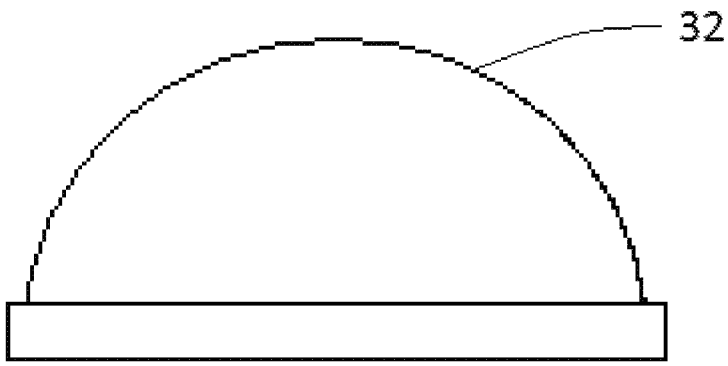

Although in one embodiment, the WCC receiving face 30 is usually a substantially flat surface, a light emitting surface 32 can comprise any shape such as a dome shape, with any thickness and at any placement position depending on the optical design, for example, shown in FIGS. 7A and 7B as described in co-pending applications (as shown in U.S. provisional Ser Nos. 61/183,004 and 61/183,025 filed on Jun. 1, 2009, the disclosure of each of which is herein incorporated by reference in its entirety). In other embodiments, an encapsulant layer of protective material, e.g., silicon, epoxy or combinations thereof, can be layered on a side of the WCC 26 distal from the LEC 22, e.g., upon the light emitting surface 32.

Figure 8:
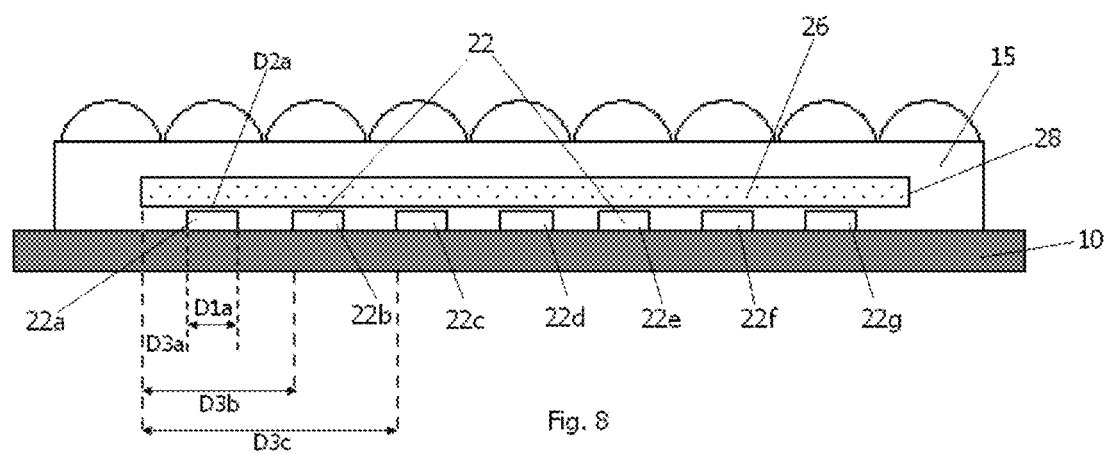
FIG. 8 illustrates a cross-sectional view of an embodiment of an array of light-emitting components.

For the practical embodiments of illumination device, any kinds of configuration like multiple LEDs may be utilized. A few examples are given in FIGS. 8, 9 and 10. As shown in FIG. 8, a light emitting device 20 comprises plural LECs 22*a-g* disposed on submount 10. In this embodiment, each of the plural LECs substantially satisfies the $D_3/D_2 \geq 1$ (e.g., $D_{3a}/D_{2a} \geq 1$). Sized and positioned in accordance with this disclosure is WCC 26 encapsulated by resin 15. Plural substantially hemispherical shapes 42 can be formed within or atop the top surface 40 of the encapsulant resin 15.

Figure 9:
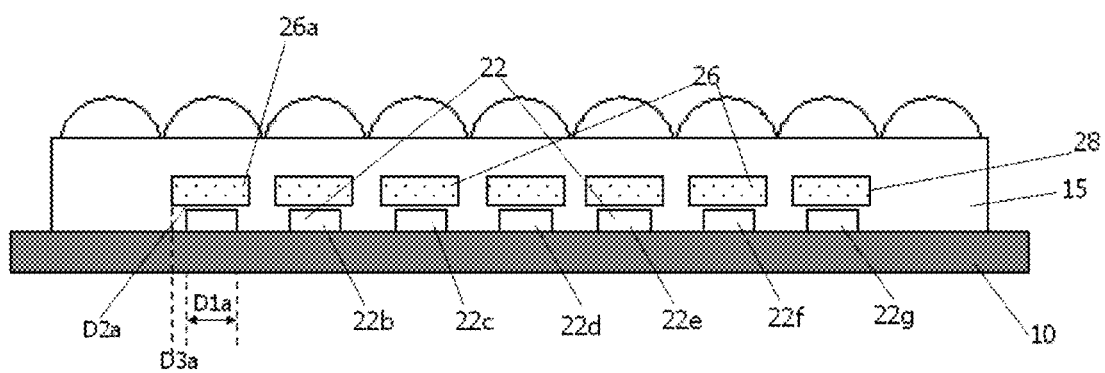
FIG. 9 illustrates a cross-sectional view of an embodiment of an array of light-emitting components.
Figure 10:
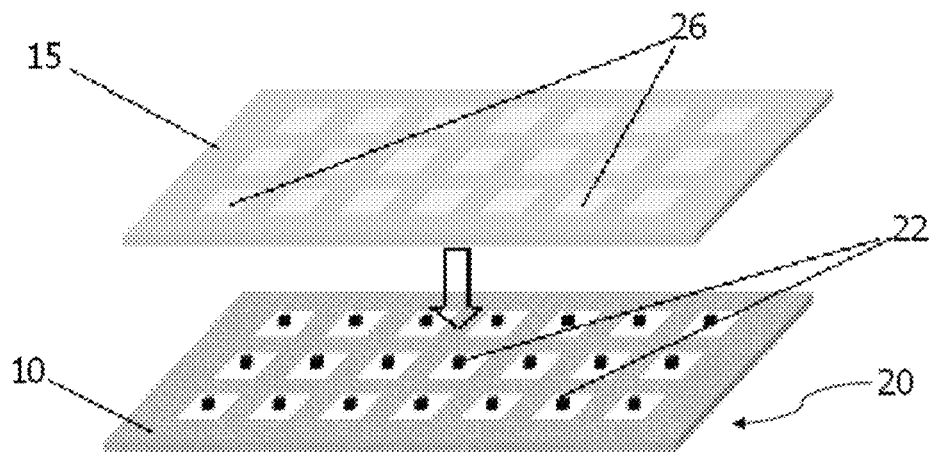
FIG. 10 illustrates an exploded perspective view of an embodiment of an array of light-emitting components.

As shown in FIGS. 9 and 10, a light emitting device 20 comprises plural LECs 22 *a-g* disposed on submount 10. Plural WCC's 26*a-g* are sized and positioned in accordance with this disclosure.

Evaluation Method of Color Fluctuation and Emitting Efficiency (Wavelength Conversion Efficiency) of the Emitting Device Mounted Luminescent WCC The luminescence efficiency and the chromaticity fluctuation of the emitting device with WCC can be evaluated by measuring the photoluminescence emitted from the phosphor layer under irradiation of excitation light of predetermined intensity.

The measurement was performed with Otsuka Electronics (Osaka, Japan) MCPD 7000 multi channel photo detector system together with required optical components such as optical fibers (Otuka Electronics), 12-inch diameter integrating spheres (Gamma Scientific [San Diego, Calif., USA], GS0IS12-TLS), calibration light source (Gamma Scientific, GS-1512-OP1) configured for total flux measurement, and excitation blue LED light source (Cree [Durham, N.C., USA] blue-LED chip, dominant wavelength 455 nm, C455EZ1000-52001).

Blue LED with peak wavelength of 455 nm was placed at the central position of the integrating sphere and was operated with a drive current of 25 mA. First the radiation power from the bare blue LED chip as excitation light was acquired. Next, a diced WCC coated with paraffin oil having similar refractive index as common encapsulation resin such as epoxy was mounted on the LED chip. Then the radiation power of the combination of the WCC and the blue LED was acquired.

The efficiency of WCC can be expressed by the following formula:

$$\text{Wavelength Conversion Efficiency} = \frac{\phi_e(Emi)}{\phi_e(Exc)} = \frac{\int P_{emi}(\lambda) \cdot d\lambda}{\int P_{exc}(\lambda) \cdot d\lambda}$$

where at any wavelength $\lambda$, $P_{exc}(\lambda)$ is the radiation power of the excitation spectrum that is incident on the phosphor layer and $P_{emi}(\lambda)$ is the radiation power in the combined spectrum of emission from the phosphor ceramic layer and the excitation light.

Therefore, the data of chromaticity can be given from MCPD data directly.

Example 1

Plasma Generated YAG:Ce Powder Synthesis 56.36 g of Yttrium (III) nitrate hexahydrate (99.9% pure, Sigma-Aldrich), 94.92 g of Aluminum nitrate nonahydrate (>98% pure, Sigma-Aldrich), and 1.30 g of Cerium (III) nitrate hexahydrate (99.99% pure, Sigma-Aldrich) were dissolved in deionized water, followed by ultrasonication for 30 min to prepare a substantially transparent solution.

The precursor solution of 2.0M concentration was then carried into a plasma reaction chamber similar to that shown and described in publication WO2008112710 A1 via an atomization probe using a liquid pump. The principle, technique and scope taught in the publication WO2008112710A1 is hereby incorporated by reference in its entirety.

The plasma powder synthesis utilizing the aforementioned precursor solution was conducted with a RF induction plasma torch (TEKNA Plasma System, Inc [Sherbrooke, Quebec, CAN] PL-35) being supplied with power from a Lepel Corp. [Edgewood, N.Y., USA] RF Power Supply operating at 3.3 MHz. For the synthesis, the chamber pressure was kept at between 25 kPa-75 kPa, and the RF generator plate power was maintained in the range of 10-30 kW. Argon was introduced into the plasma torch as both a swirling sheath gas (20-100 slm [standard liters per minute]) and a central plasma gas (10-40 slm). Sheath gas flow was supplemented by addition of hydrogen (1-10 slm). Reactant injection was performed using a radial atomization probe (TEKNA Plasma System, Inc SDR-772) which operates on the principle of two-fluid atomization. The probe was positioned at the center of the plasma plume during reactant injection. The reactants were fed into the plasma plume by in-situ atomization at a rate of 1-50 ml/min during synthesis. Atomization of the liquid reactant was performed with Argon as atomizing gas delivered at a flow rate of 1-30 slm. The reactants when passing through the hot zone of the RF thermal plasma underwent a combination of evaporation, decomposition and nucleation. The nucleated particles were collected from the flow stream onto suitable porous ceramic or glass filters.

Preparation of WCC

Plasma synthesized yttrium aluminum garnet powder (5.0 gram) containing 0.20 mol % cerium with respect to yttrium was added to a high purity alumina combustion boat and annealed in a tube furnace (MTI GSL 1600) at 1200° C. for about 2 hours under the reducing atmosphere. BET surface area of annealed YAG powders was measured to be about 5.5 $m^2/g$.

Plasma synthesized yttrium aluminum garnet (YAG) powder (5 gram) was added to high purity alumina ball mill jar containing 15 g of $ZrO_2$ balls of 3 mm in diameter. Poly(vinyl butyral-co-vinyl alcohol-co-vinyl acetate) (0.25 gram) and Tetraethyl Orthosilicate (0.2 gram) were added to the ball mill jar together with Ethanol (20 ml) The mixture was ball-milled to produce a slurry followed by drying in an agate mortar until the ethanol evaporated completely.

Ten (10) tablets using 420 mg each of plasma YAG powder were prepared by using metal dies of 20×20 mm and pressing at a uniaxial force of 12 tons in a hydraulic press. For debindering, preformed tablets were heated at 800° C. for about 2 hours in air to remove organic components. Following debindering, the preform tablets were sintered in vacuum at about 1550° C. for 5 hours.

After sintering, each luminescent WCC was diced 9 pieces into 2 mm×2 mm using a dicer (MTI, EC400) resulting in 90 pieces each for materials made as described for Example 1, Example 2 and Comparative Example 1.

Optical Measurement

The chromaticity and efficiency measurement was performed with Otsuka Electronics MCPD 7000 multi channel photo detector system together with required optical components such as optical fibers (Otuka Electronics), 12-inch diameter integrating spheres (Gamma Scientific, GS0IS12-TLS, calibration light source (Gamma Scientific, GS-IS12-OP1) configured for total flux measurement, and excitation light source (Cree blue-LED chip, dominant wavelength 455 nm, C455EZ1000-S2001).

A blue LED with peak wavelength of 455 nm was then placed at the central position of the integrating sphere and was operated with a drive current of 25 mA. First the radiation power from the bare blue LED chip as excitation light was acquired. The light emitting face distance of LED chip was 1 mm. A diced 2 mm×2 mm WCC was coated with paraffin oil having similar refractive index as common encapsulation resin such as epoxy (for example about 1.45) was then mounted a distance of about 100 μm from LED chip. The radiation powder of the combination of the WCC and the blue LED was then acquired. The entire sample sizes (90 pieces) were measured in the same manner.

Example 2

The procedure of Example 1 was followed except that the amount of Plasma YAG powder used was 360 mg instead of 420 mg to provide an equivalent thickness to that of Example 1 and dicing size was 3 mm×3 mm.

The tablets were produced by following procedures in Example 1 for debinding, sintering, optical measurement.

Example 3

The procedures of Example 1 were followed except that the distance from LED chip was set at about 300 μm. The tablets used in this example were produced by following procedures in Example 1 for debinding, sintering, dicing and optical measurement.

Comparative Example 1

The procedure of Example 1 was followed except that the amount of Plasma YAG powder was used 460 mg instead of 420 mg to provide an equivalent thickness to that of Example 1 and dicing size was 1 mm×1 mm (the thickness of luminescent WCC can be changed by adjusting the amount of powder). The tablets used in this example were produced by following procedures in Example 1 for debinding, sintering, optical measurement.

Comparative Example 2

The procedure of Example 1 is followed except the distance from LED chip was used 1100 μm. Tablets were produced by following the procedures in Example 1 for debinding, sintering, dicing and optical measurement.

Summary of Evaluation Results

Table 1 recites the different size and distance relationships amongst the Examples and the Comparative Example described above.

TABLE 1

|  | WCC size [mm] | Distance between WCC and LED [μm] |
|---|---|---|
| Example 1 | 2 × 2 | 100 |
| Example 2 | 3 × 3 | 100 |
| Example 3 | 2 × 2 | 300 |
| Comparative Example 1 | 1 × 1 | 100 |
| Comparative Example 2 | 2 × 2 | 1100 |

Figure 11A:
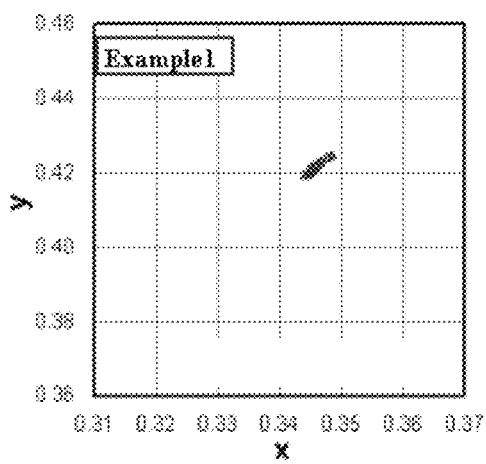
FIG. 11A illustrates a graph depicting the CIE color coordinates (Commission Internationale de L'Eclairage) of 90 2 mm×2 mm ceramic members positioned 100 μm from the LED surface.
Figure 11B:
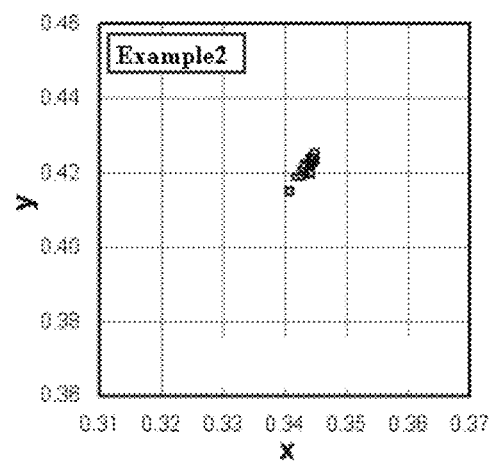
FIG. 11B illustrates a graph depicting the CIE color coordinates (Commission Internationale de L'Eclairage) of the 90 3 mm×3 mm ceramic members positioned 100 μm from the LED surface.
Figure 11C:
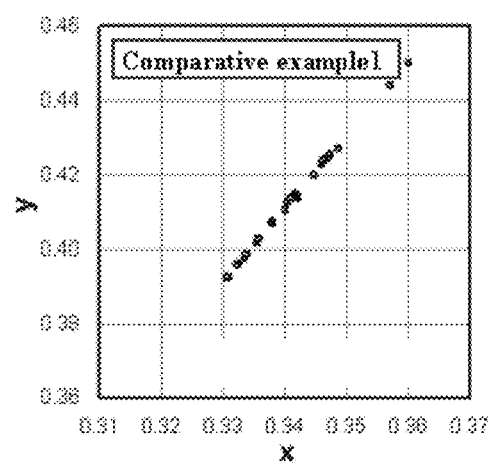
FIG. 11C illustrates a graph depicting the CIE color coordinates (Commission Internationale de L'Eclairage) of the 90 1 mm×1 mm ceramic members positioned 100 μm from the LED surface.

FIGS. 11A-11C depict the CIE coordinates of each member of each sample group and illustrate the reduced chromatic variability within a manufactured lot or plurality of light emitting devices in accordance with the present invention. Examples 1 (FIG. 11A) had CIE coordinates of about Cy of about 0.4205±0.0025 and Cx of about 0.3475±0.0025. Example 2 (FIG. 11B) had CIE coordinates of Cy of about 0.420±0.0025 and Cx of about 0.3425±0.0025. Comparative Example 1 (FIG. 11C) had CIE coordinates of about Cy of about 0.420±0.03 and Cx of about 0.345±0.015.

Figure 12A:
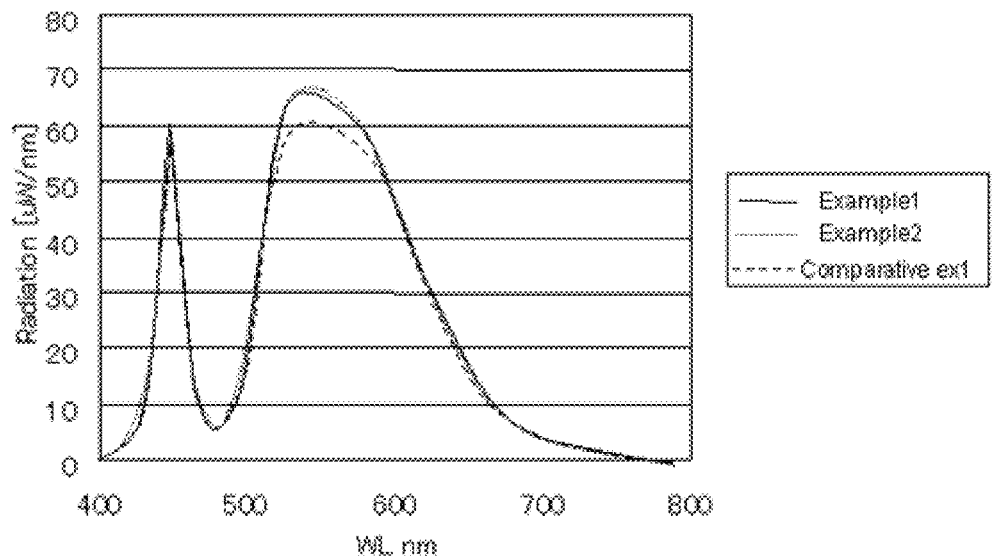
FIG. 12A illustrates a graph depicting the relationship between radiation [μW/nm] and wavelength (WL) [nm] of a light emitting device having 2 mm×2 mm ceramic member positioned 100 μm from the LED surface; a light emitting device having 3 mm×3 mm ceramic members positioned 100 μm from the LED surface; and a light emitting device having a 1 mm×1 mm ceramic member positioned 100 μm from the LED surface.
Figure 12B:
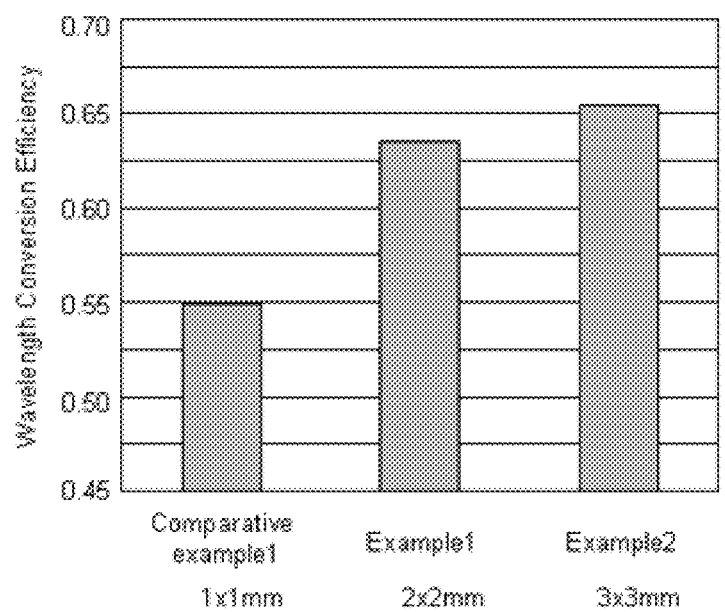
FIG. 12B illustrates a bar graph depicting the wavelength conversion efficiency [mW/mW] of a light emitting device having 2 mm×2 mm ceramic member positioned 100 μm from the LED surface [Example 1]; a light emitting device having 3 mm×3 mm ceramic members positioned 100 μm from the LED surface [Example 2]; and a light emitting device having a 1 mm×1 mm ceramic member positioned 100 μm from the LED surface [Comparative Example 1].

As shown in FIG. 12A, Examples 1 and 2 emitted greater radiation over the spectrum between about 550 nm and about 625 nm than that of Comparative Example 1. As shown in FIG. 12B, Examples 1 and 2 further demonstrated greater wavelength efficiency than that of Comparative Example 1.

Examples 4-6 and Comparative Examples 3 and 4

The procedures of Example 1 (the distance from LED chip will be set at about 100 um and a 1×1 mm chip will be used), except that the size of the luminescent WCC (and thus D3) will be varied as set forth in Table 2 below.

TABLE 2

| (D1 = 1 mm; D2 = 100 μm) | | | | | |
|---|---|---|---|---|---|
|  | | WCC | | | |
| Example | D3 | area | D3/D2 | Cy | Cx |
| Ex 1 | 500 μm | 400% | 5.0 | 0.4205 ± 0.0025 | 0.3475 ± 0.0025 |
| Com. Ex. 3 | 90 μm | 121.00% | 0.90 | | |
| Com. Ex. 1 | About 0 μm | 100% | 0 | 0.420 ± 0.03 | 0.345 ± 0.015 |
| Ex 4 | 100 μm | 148.84% | 1.0 | | |
| Ex 5 | 110 μm | 156.25% | 1.10 | | |
| Ex 6 | 200 μm | 196.00% | 2.0 | | |
| Com. Ex 4 | 2000 μm | 1800.00% | 20.0 | | |
| Ex 2 | 1000 μm | 900.00% | 10.0 | 0.420 ± 0.0025 | 0.3425 ± 0.0025 |

Examples 7-8

D1=1 mm; D3=500 μm

The procedures of Example 1 (the size of the WCC will be set at about 2×2 mm [D3=500 um] and a 1×1 mm light emitting chip will be used), except that the distance the WCC from the LED chip will be varied as set forth in Table 3 below.

TABLE 3

| Example | D2 | WCC area | D1/D2 | D3/D2 | Cy | Cx |
|---|---|---|---|---|---|---|
| Ex 1 | 100 μm | 400% | 10.0 | 5.0 | 0.4205 ± 0.0025 | 0.3475 ± 0.0025 |
| Ex 8 | 200 μm | 400% | 5.0 | 2.5 | | |
| Ex 3 | 300 μm | 400% | 3.3 | 1.67 | | |
| Ex 7 | 450 μm | 400% | 2.2 | 1.1 | | |
| Com. Ex. 2 | 1100 μm | 400% | 0.9 | 0.45 | | |

It is anticipated that light emitting devices described above will provide a $C_y$ variation of less than about ±0.03, e.g., less than about ±0.003.

It will be appreciated by those skilled in the art that various omissions, additions and modifications may be made to the processes described above without departing from the scope of the invention, and all such modifications and changes are intended to fall within the scope of the invention.

What is claimed is:

1. A light emitting device comprising:
    at least one light emitting component (LEC) for emitting light with a wavelength between about 360 nm to about 500 nm, said LEC comprising a light-emitting face having a longest linear dimension $D_1$;
    at least one wavelength-converting consolidated monolithic component (WCC) for re-emitting the light at a different wavelength, said WCC having a light-receiving face, a light-emitting face, and a peripheral edge, said WCC being radiationally linked to and spaced apart from the LEC at a distance $D_2$, $D_2$ being less than $D_1$,
    wherein a projection edge of the light-emitting face of the LEC and the peripheral edge of the WCC define a minimized distance $D_3$ therebetween,
    wherein a surface area of the light-receiving face of the WCC is at least 120% of a surface area of the light-emitting face of the LEC, and
    wherein the LEC and WCC are positioned relative to each other to satisfy $D_3/D_2 \geq 1$.

2. The light emitting device of claim 1, wherein the surface area of the WCC is at least 140% of the surface area of the LEC.

3. The light emitting device of claim 1, wherein the surface area of the WCC is at least 200% of the surface area of the LEC.

4. The light emitting device of claim 1, wherein $D_1$ is between about 0.50 mm and about 3.50 mm; $D_2$ is between about 50 μm to about 400 μm; and $D_3$ is between about 0.50 mm to about 2.50 mm.

5. The light emitting device of claim 1, wherein the at least one WCC comprises at least one phosphor.

6. The light emitting device of claim 1, wherein the at least one WCC comprises at least two phosphors, the phosphors having peak emissive wavelengths at least about 15 nm apart.

7. The light emitting device of claim 1, wherein the emission by the LEC and the at least one WCC is white light having a CIE color chromaticity (x, y) of (0.33±0.15, 0.33±0.15).

8. The light emitting device of claim 1, wherein the LEC emits light with a wavelength between about 360 nm to about 500 nm, which is UV or blue light, and the WCC emits light with a wavelength between about 520 nm to about 590 nm, which is yellow light.

9. The light emitting device of claim 1, wherein the LEC emits light with a wavelength between about 360 nm to about 500 nm, which is blue light, and the WCC emits light with a wavelength between about 490 nm to about 570 nm, which is green light, and light with a wavelength between about 620 nm to about 750 nm, which is red light.

10. The light emitting device of claim 1, wherein the WCC comprises a garnet.

11. The light emitting device of claim 1, wherein the WCC comprises plasma generated phosphors.

12. The light emitting device of claim 1, wherein the WCC comprises a partially sintered ceramic.

13. The light emitting device of claim 1, wherein the WCC comprises a glass-phosphor composite.

14. The light emitting device of claim 1, wherein the WCC comprises a sintered ceramic.

15. The light emitting device of claim 1, wherein the WCC comprises the translucent ceramic.

16. A method for making a light emitting device comprising:
    providing at least one light-emitting component (LEC) for emitting light with a wavelength between about 360 nm and about 500 nm, said LEC comprising a light-emitting face having a longest linear dimension $D_1$;
    providing at least one wavelength-converting consolidated monolithic component (WCC) for re-emitting the light at a different wavelength, said WCC having a light-receiving face, a light-emitting face, and a peripheral edge, said light-receiving face of the WCC having a surface area which is at least 120% of a surface area of the light-emitting surface area of the LEC,
    wherein a projection edge of the light-emitting face of the LEC and the peripheral edge of the WCC define a minimized distance $D_3$ therebetween,
    positioning the LEC and WCC relative to each other to radiationally link the WCC to the LEC and space the WCC apart from the LEC at a distance $D_2$, $D_2$ being less than $D_1$, and
    positioning the LEC and WCC relative to each other to satisfy $D_3/D_2 \geq 1$.

* * * * *